United States Patent
Won et al.

(10) Patent No.: US 10,312,475 B2
(45) Date of Patent: Jun. 4, 2019

(54) CVD THIN FILM STRESS CONTROL METHOD FOR DISPLAY APPLICATION

(71) Applicant: Applied Materials, Inc., Santa Clara, CA (US)

(72) Inventors: Tae Kyung Won, San Jose, CA (US); Soo Young Choi, Fremont, CA (US); Sanjay D. Yadav, San Jose, CA (US); Carl A. Sorensen, Morgan Hill, CA (US); Chien-Teh Kao, Sunnyvale, CA (US); Suhail Anwar, Saratoga, CA (US); Young Dong Lee, Hwaseong-Si (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/613,667

(22) Filed: Jun. 5, 2017

(65) Prior Publication Data
US 2018/0331328 A1 Nov. 15, 2018

Related U.S. Application Data

(60) Provisional application No. 62/506,234, filed on May 15, 2017.

(51) Int. Cl.
*H01L 21/00* (2006.01)
*H01L 51/56* (2006.01)
(Continued)

(52) U.S. Cl.
CPC .......... *H01L 51/56* (2013.01); *H01L 51/0035* (2013.01); *H01L 51/0097* (2013.01);
(Continued)

(58) Field of Classification Search
CPC ............ H01L 51/0035; H01L 51/0097; H01L 51/5203; H01L 51/5253; H01L 51/56; C23C 16/345; C23C 16/452; C23C 16/45565; C23C 16/511; C23C 16/50; C23C 16/52
(Continued)

(56) References Cited

U.S. PATENT DOCUMENTS 5,863,376 A * 1/1999 Wicker ............ C23C 16/45565
6,756,324 B1 6/2004 Gates
(Continued)

FOREIGN PATENT DOCUMENTS

TW 201602388 A 1/2016

OTHER PUBLICATIONS

Nguyen, S. V.—"High-density plasma chemical vapor deposition of silicon-based dielectric films for integrated circuits," IBM Journal of Research & Development, vol. 43, No. 1/2—Plasma processing, 1999, 19 pages.
(Continued)

*Primary Examiner* — Brook Kebede
(74) *Attorney, Agent, or Firm* — Patterson + Sheridan LLP

(57) ABSTRACT

Embodiments of the present disclosure generally describe a method for depositing a barrier layer of SiN using a high density plasma chemical vapor deposition (HDP-CVD) process, and in particular, controlling a film stress of the deposited SiN layer by biasing the substrate during the deposition process.

19 Claims, 10 Drawing Sheets

(51) Int. Cl.
*H01L 51/52* (2006.01)
*H01L 51/00* (2006.01)

(52) U.S. Cl.
CPC ...... *H01L 51/5203* (2013.01); *H01L 51/5253* (2013.01); *H01L 2251/301* (2013.01); *H01L 2251/303* (2013.01); *H01L 2251/5338* (2013.01)

(58) Field of Classification Search
USPC .......................................... 438/792; 118/699
See application file for complete search history.

(56) References Cited

U.S. PATENT DOCUMENTS

| | | | |
|---|---|---|---|
| 8,883,269 | B2 | 11/2014 | Won et al. |
| 2005/0202662 | A1 | 9/2005 | Joshi et al. |
| 2005/0255712 | A1 | 11/2005 | Kato et al. |
| 2009/0215281 | A1 | 8/2009 | Mungekar et al. |
| 2010/0012032 | A1 | 1/2010 | Chen |
| 2010/0052040 | A1 | 3/2010 | Kohno et al. |
| 2012/0217221 | A1* | 8/2012 | Hoffman ............... C23C 14/345 216/61 |
| 2015/0009425 | A1* | 1/2015 | Kwon ............... G02F 1/133345 349/12 |
| 2015/0065642 | A1* | 3/2015 | Chau ....................... C23C 14/06 524/546 |
| 2015/0194637 | A1* | 7/2015 | Ishikawa ............... C23C 16/345 438/792 |
| 2016/0362788 | A1* | 12/2016 | Kurita ............... C23C 16/45548 |

OTHER PUBLICATIONS

Murtha, Tom—"Metanational Management in the TFT-LCD Industry" presentation, Research Institute of Economy, Trade and Industry (RIETI) Policy Symposium, Metanational Management and Global Innovation: The Case of the TFT-LCD Industry, Tokyo, Mar. 14, 2007, The Alfred P. Sloan Foundation Flat Panel Display Industry Study Team, 57 pages.
PCT International Search Report and Written Opinion dated Nov. 14, 2018, for International Application No. PCT/US2018/027787.
Taiwan Office Action dated Mar. 14, 2019, for Taiwan Patent Application No. 107115817.

* cited by examiner ic amplifier.
CVD THIN FILM STRESS CONTROL METHOD FOR DISPLAY APPLICATION

CROSS-REFERENCE TO RELATED APPLICATIONS

This application claims benefit of U.S. Provisional Patent Application Ser. No. 62/506,234, filed May 15, 2017, which is herein incorporated by reference.

BACKGROUND

Field

Embodiments described herein generally relate to a method for manufacturing a thin film encapsulation (TFE) structure for an organic light emitting diode (OLED) device and a method for depositing a silicon nitride film using high density plasma chemical vapor deposition (HDP-CVD).

Description of the Related Art

Organic light emitting diode displays (OLED displays) have recently gained significant interest in display applications in view of their faster response times, larger viewing angles, higher contrast, lighter weight, lower power consumption and amenability to being formed on flexible substrates as compared to conventional LCD or plasma displays. Generally, a conventional OLED device is enabled by using at least two layers of organic materials sandwiched between two electrodes. The two layers of organic materials include one layer capable of monopolar (hole) transport and another layer capable of electroluminescence, and thus they lower the required operating voltage for the OLED display compared to an OLED display having a single layer for hole transport and electroluminescence.

In addition to organic materials used in OLED devices, many polymer materials have been developed for small molecule, flexible organic light emitting diode (FOLED) and polymer light emitting diode (PLED) displays. Many of these organic and polymer materials are suitable for the fabrication of complex, multi-layer devices on a range of substrates, making them ideal for various transparent multi-color display applications, such as thin flat panel display (FPD), electrically pumped organic laser, and organic optical amplifier.

OLED devices may have limited lifetimes, characterized by a decrease in electroluminescence efficiency and an increase in drive voltage thereof. One known reason for these degradations of OLED device performance is the formation of non-emissive dark spots or regions within an OLED display due to moisture or oxygen ingress into the organic layers of the OLED device. For this reason, OLED devices are typically encapsulated, i.e. surrounded by moisture transport limiting, yet transparent, materials. One method of encapsulating OLED display devices employs a multilayer stack of barrier layers and buffer layers. Typically the barrier layers comprise a transparent dielectric film, such as silicon nitride and the buffer layers comprise a transparent polymerized organic film. The buffer layer is intended to provide a planarized layer over surface irregularities in the previously deposited barrier layer, cover undesirable particles unavoidably deposited in upstream processes, relax stacked film stresses, increase the permeation channel length between voids in the barrier layers, and decouple intrinsic defects found in the barrier layers. It has been observed that existing encapsulation layers may have difficulty in preventing failure of OLED devices as a result of moisture or oxygen ingress into the organic layers of the OLED device over time.

Accordingly, there is a need in the art for encapsulation layers with superior barrier properties.

SUMMARY

The present disclosure generally comprises a method of depositing a silicon nitride layer using a high density plasma chemical vapor deposition (HDP-CVD) process, resulting in a silicon nitride layer with low film stress and/or compressive film stress, by biasing an electrode coupled to a substrate support during deposition of the silicon nitride film. The method generally comprises heating a substrate disposed on a substrate support in a HDP-CVD processing chamber, biasing an electrode coupled to the substrate support, flowing a silicon precursor gas and a nitrogen precursor gas into the processing chamber, forming a high density plasma of the precursor gases, and depositing a silicon nitride layer on the substrate.

BRIEF DESCRIPTION OF THE DRAWINGS

So that the manner in which the above recited features of the present disclosure can be understood in more detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally describe a method for depositing a barrier layer of silicon nitride on a substrate, including over previously formed layers on the substrate, using a high density plasma chemical vapor deposition (HDP-CVD) process, and in particular, controlling a film stress of the deposited silicon nitride layer by a controlled biasing of the substrate during the deposition process.

Encapsulation of OLED devices improves the lifetime of the device by preventing the degradation of the OLED device due to moisture or oxygen ingress there into. One method of forming a thin film encapsulation structure includes depositing multilayer stacks of barrier layers with buffer layers sandwiched there between. Typically the barrier layers comprise a dielectric such as silicon nitride and the buffer layers comprise a polymerized organic.

Encapsulation stacks of silicon nitride and polymerized organic film layers, using silicon nitride layers deposited using the high density plasma CVD processes described herein, have superior barrier properties compared to encapsulation stacks having conventionally deposited silicon nitride layers, which is desirable in an encapsulation structure. Conventional capacitively coupled plasma (CCP) PECVD deposited silicon nitride layers generally have a compressive film stress that can be maintained below about 150 MPa by tuning conventional process parameters, such as the flow rates of a carrier gases like argon or nitrogen. In comparison, HDP-CVD silicon nitride layers tend to have a high tensile film stress, and it is difficult to adjust the resulting tensile stress in the silicon nitride film layer adjusting conventional process parameters. The resulting tensile stress in a silicon nitride film deposited using a HDP-CVD process can cause a silicon nitride barrier layer deposited using HDP-CVD to pull at the polymerized organic buffer layer over which it is deposited, thereby creating undesirable cracks in the thin film encapsulation (TFE) structure and/or the OLED device beneath. Herein, by applying and controlling a bias voltage on a substrate during HDP-CVD deposition of silicon nitride, greater control over the resulting film stress of the silicon nitride barrier layer results. Applying a low frequency bias, such as below 1 MHz allows for the deposition of compressive silicon nitride by HDP-CVD.

Figure 1:
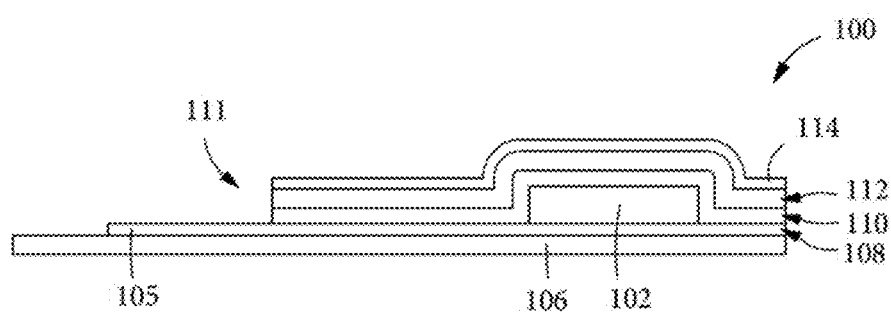
FIG. 1 is a schematic cross sectional view of an OLED device, according to embodiments described herein.

FIG. 1 shows an OLED device 100 formed with a TFE structure 111, according to embodiments described herein. The OLED device 100 includes a substrate 106 having an OLED 102, formed from a series of deposition and etching processes, disposed thereon. Typically the substrate is made of glass or metal, for example, and in some embodiments the substrate is made of a thin flexible polymer sheet, such as a polyethyleneterephthalate (PET) or a polyethyleneterephthalate (PEN) sheet. The OLED device 100 includes a contact layer 108 disposed between the OLED 102 and the substrate 106 where the contact layer comprises a transparent conductive oxide such as indium tin oxide, indium zinc oxide, zinc oxide, or tin oxide. The TFE structure 111 is formed over the OLED 102 to protect the OLED device from performance degradation resulting from moisture and oxygen ingress there into. For use of illustration, the TFE structure 111 includes a first barrier layer 110, a buffer layer 112, and a second barrier layer 114. In other embodiments, the TFE structure 111 includes a plurality of buffer layers where each buffer layer is disposed between two barrier layers, such a barrier layers 110 and 114.

Typically, the first barrier layer 110 comprises a dielectric film such as silicon nitride (SiN), silicon oxynitride (SiON), silicon dioxide ($SiO_2$), aluminum oxide ($Al_2O_3$), aluminum nitride (AlN), titanium oxide ($TiO_2$), zirconium (IV) oxide ($ZrO_2$), aluminum titanium oxide (AlTiO), aluminum zirconium oxide (AlZrO), zinc oxide (ZnO), indium tin oxide (ITO), AlON, or combinations thereof. The buffer layer 112 is an organic layer, such as a hexamethyldisiloxane (HMDSO) layer, for example a fluorinated plasma-polymerized HMDSO (pp-HMDSO:F) and/or a polymer material composed of hydrocarbons where the polymer material has a formula $C_xH_yO_z$, wherein x, y and z are integers. In other embodiments, the buffer layer material is selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene, and combinations thereof. Herein, at least one of the barrier layers is a silicon nitride layer deposited using the methods described in this disclosure.

Figure 2A:
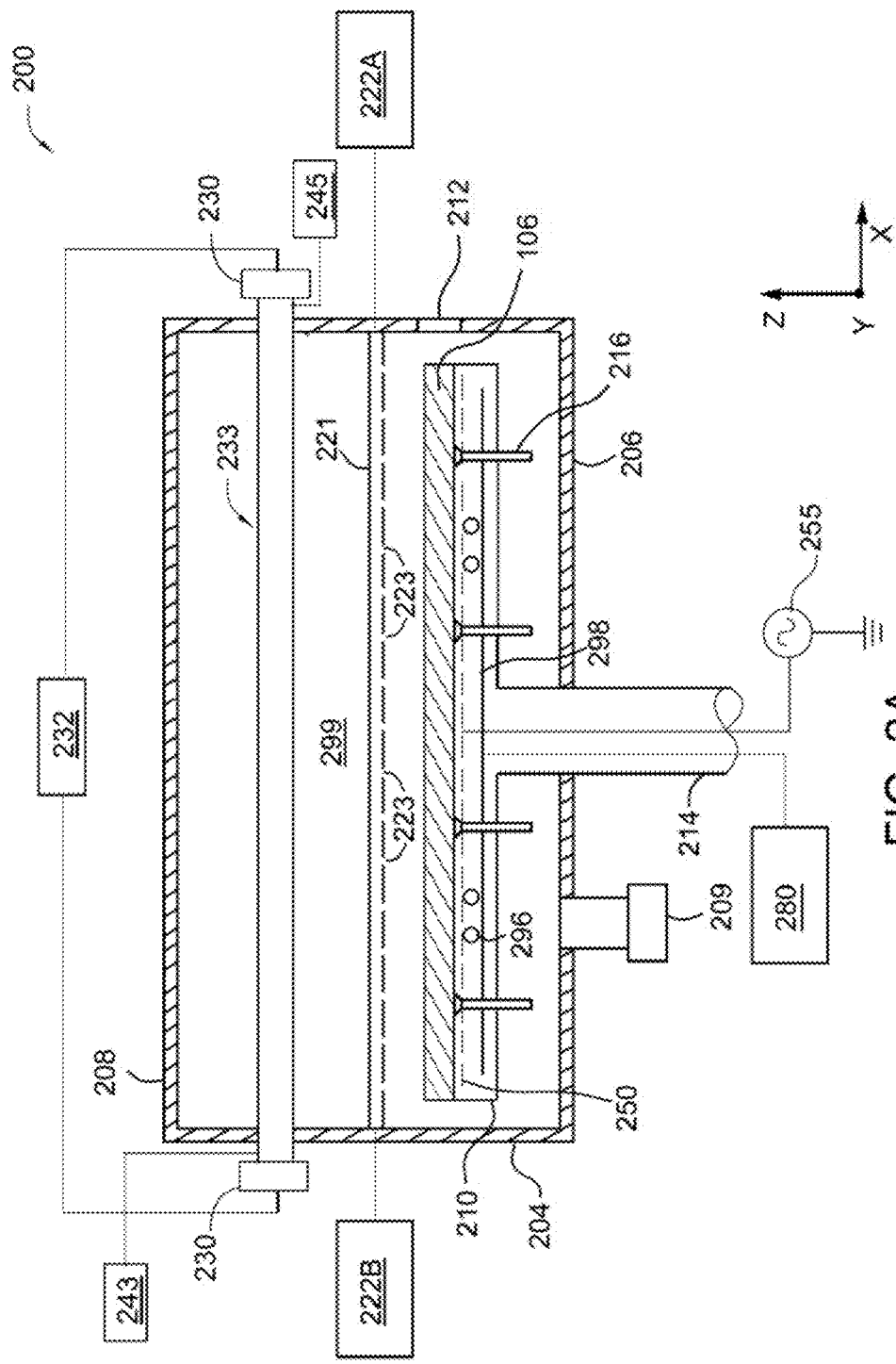
FIG. 2A is a schematic cross-sectional view of one embodiment of a processing chamber that may be used to practice the methods described herein.

FIG. 2A is a schematic view of an example of a processing chamber 200 used for deposition of silicon nitride onto a substrate 106, according to the methods described herein. The processing chamber 200 is configured to process large area substrates, such as substrates having a surface area greater than about 1 $m^2$, such as greater that about 2 $m^2$. The processing chamber 200 is configured to process a substrate which is oriented in a horizontal position. In other embodiments, the methods described herein are used in a processing chamber configured to process substrates oriented in a vertical or substantially vertical position.

The processing chamber 200 features one or more side walls 204, a chamber lid 208, and a chamber bottom 206 which define a processing volume 299. The processing volume 299 is fluidly coupled to a vacuum 209 such as one or more dedicated vacuum pumps and has a substrate support 210 disposed therein. The substrate support 210 includes a shaft 214 sealingly extending through the chamber bottom 206, which raises and lowers the substrate support 210 to facilitate transfer of the substrate 106 to and from the processing chamber 200.

The substrate 106 is loaded into the processing volume 299 through an opening 212 in one of the side walls 204, which is conventionally sealed with a door or a valve (not shown) during deposition processes. A plurality of lift pins 216 are movably disposed through the substrate support 210 to facilitate transferring of the substrate 106 to and from the substrate support 210. When the substrate support 210 is in a lowered position the plurality of lift pins 216 extend above the surface of the substrate support 210 thereby lifting the substrate 106 for access by a robot handler. When the substrate support 210 in a raised processing position the plurality of lift pins 216 are flush with, or below, the surface of the substrate support 210 and the substrate 106 rests directly on the substrate support 210 for processing. The lift pins can be moved by contact of their lower ends with a stationary or movable pin plate (not shown), or the base of the processing chamber 200.

Herein, the substrate support 210 includes a resistive heater 298 coupled to a controller 280 as well as cooling fluid conduits 296 that in combination are used to control the temperature of the substrate 106 disposed on the substrate support 210 during deposition.

To provide an electrical bias to the substrate support 210 during deposition, the substrate support 210 includes a bias electrode 250 disposed on or in the substrate support 210. The bias electrode 250 is coupled to a bias power supply 255 which provides DC power, pulsed DC power, AC power, pulsed AC power, RF power, pulsed RF power, or a combination thereof. In one embodiment, the substrate support 210 is subjected to an electrical bias during deposition by charging the bias electrode 250 to create a negative bias on the substrate support 210 and/or the substrate 106. In some embodiments, the substrate support 210 further comprises an electrostatic chuck electrode (not shown) on or in the substrate support 210. Typically, the electrostatic chuck electrode is coupled to a DC power source.

Figure 2B:
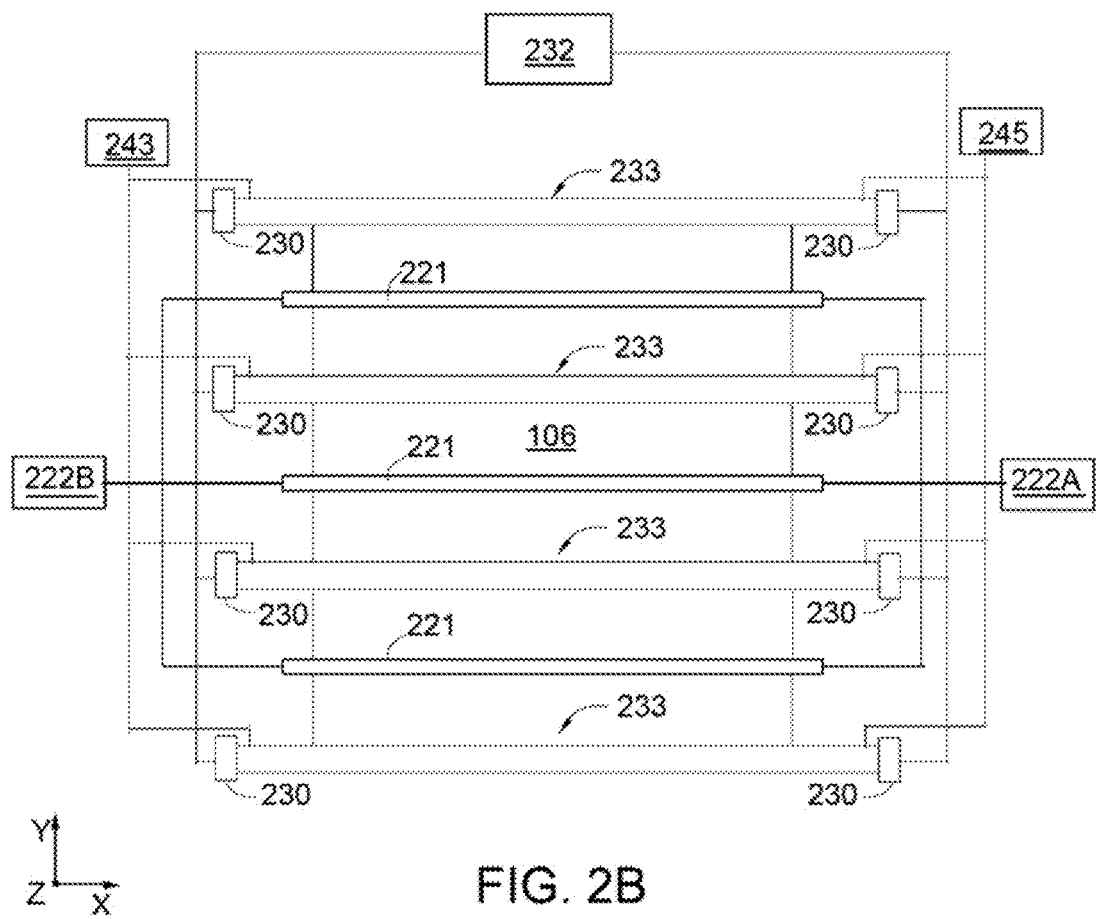
FIG. 2B is a cross sectional view of an antenna used in the processing chamber of FIG. 2A.

As shown in FIGS. 2A and 2B, process gases used to form the high density plasma are distributed into the processing volume 299 using a plurality of tubular gas distribution conduits 221, disposed within the processing volume 299, that are fluidly coupled to gas inlets 222A and 222B. The plurality of gas distribution conduits 221 are located between the substrate 106 disposed on the substrate support 210 and the plane in which a plurality of antennas 233 are located, in a gas distribution plane where each gas distribution conduit 221 is spaced apart from the surface of the substrate by substantially the same vertical spacing distance, such as between about 3000 mil and about 10000 mil. A plurality of holes 223 disposed in the gas distribution conduits 221 face the substrate 106 and provide a substantially uniform gas flow over the surface of the substrate 106. Herein, a silicon precursor and one or more nitrogen precursors, along with a carrier gas when used, are mixed to flow together through the same gas distribution conduit 221. Each end of the gas distribution conduit 221 is coupled to a gas inlet 222A or 222B to provide a more uniform pressure along the length of the gas distribution conduit 221, and thus a more uniform gas flow from the plurality of holes 223 disposed therein. In other embodiments, each of the precursor gases flow through separate gas distribution conduits 221 to prevent them from reacting before they reach the surface of the substrate.

The processing chamber 200 enables high density plasma assisted CVD using a plurality of antennas 233 disposed within and extending across, the processing volume 299. In this embodiment, the high density plasma source is a linear microwave plasma source (LPS), however, the methods described herein can be used with any suitable high density plasma source, such as electron cyclotron resonance plasma source (ECR) or an inductively coupled RF plasma source (ICP). Herein, the plurality of antennas 233 extend through a dielectric tube 237 extending across the process chamber to provide an interior volume spanning the processing chamber isolated from the processing volume 299 of the processing chamber 200 and each is located in the antenna plane between the chamber lid 208 and the planar arrangement of the plurality of gas distribution conduits 221. One or more microwave generators 230, each coupled to a power source 232, are coupled to one or both ends of each of the antennas 233. Cooling gas flow is provided to each of the antennas 233 from a cooling gas inlet 243 coupled to a first end of each of the dielectric tubes 237 and a cooling gas exhaust 245 coupled to a second end of each of the dielectric tube 237. Typical cooling gases include clean dry air (CDA) and $N_2$.

Figure 2C:
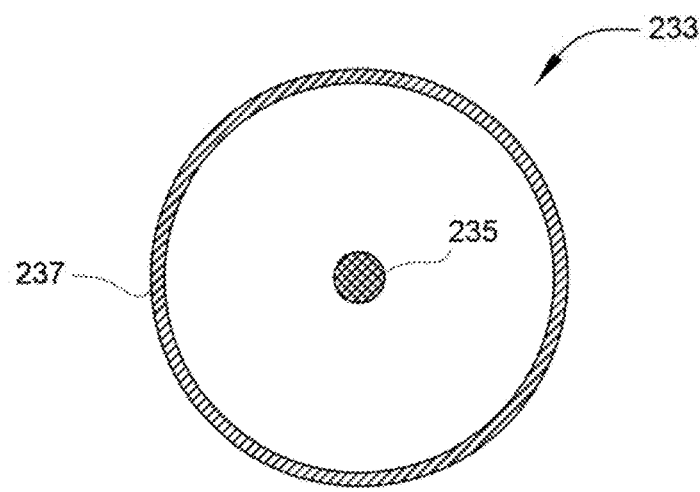
FIG. 2C is a schematic plan view of portions of the processing chamber of FIG. 2A.

FIG. 2C is a cross sectional view of one of the plurality of antennas 233. The antenna 233 generally includes a conductive stub 235 for radiating microwave energy into the processing volume surrounded by a dielectric tube 237, such as a quartz tube, substantially coaxial therewith. Electromagnetic waves from the stubs 235 are radiated into the processing volume 299 through the dielectric tube 237 where they form a plasma using the process gases introduced from the plurality of gas distribution conduits 221.

FIG. 2B illustrates a plan view of some features of the processing chamber 200 shown in FIG. 2A. The plurality of gas distribution conduits 221 are arranged parallel to, and longitudinally spaced from, one another. Each of the gas distribution conduits 221 are located between two parallel antennas of the plurality of antennas 233, where the two antennas are located above two ends of the substrate 106 and the remaining antennas of the plurality of antennas 233 are regularly spaced there between.

Figure 3:
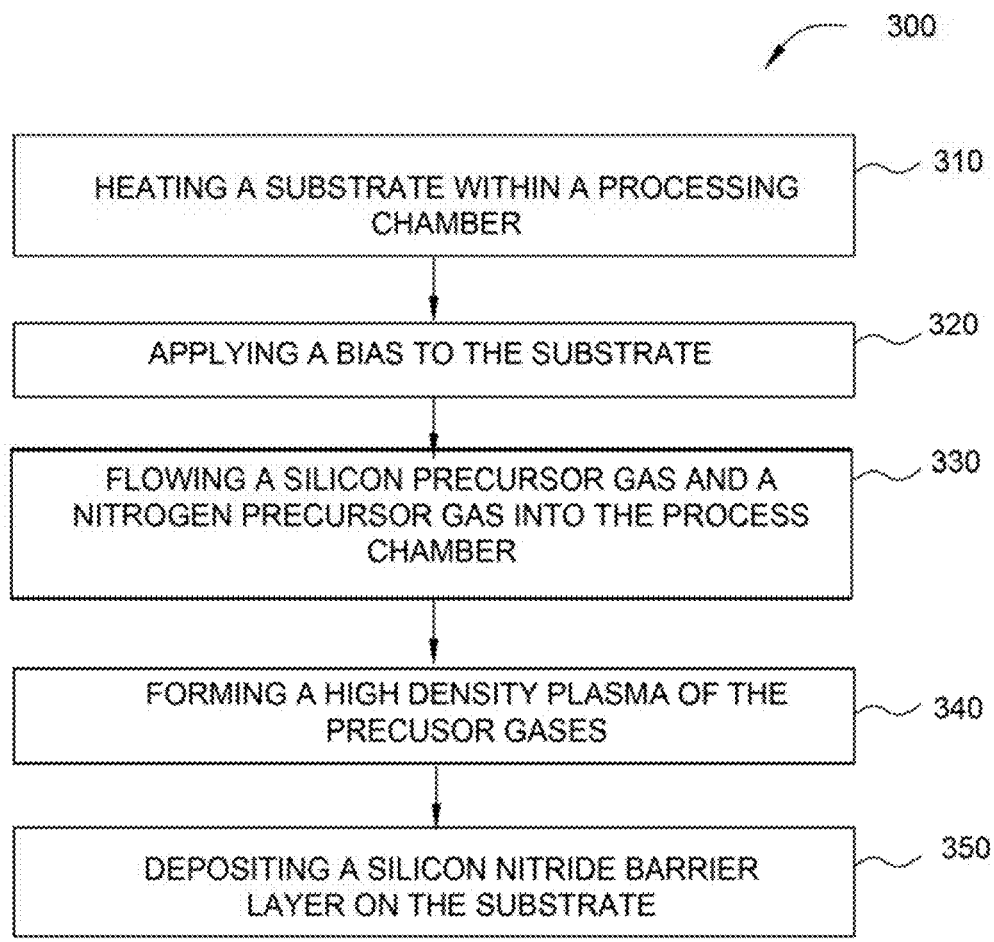
FIG. 3 is a flow diagram of a method for depositing a silicon nitride layer, according to one embodiment.

FIG. 3 is a flow diagram outlining a method 300 for depositing a silicon nitride barrier layer, according to one embodiment of the disclosure. In some embodiments, the silicon nitride layer is a first barrier layer in a thin film encapsulation (TFE) structure. In other embodiments, the silicon nitride barrier layer is deposited onto, and in contact with, a buffer layer previously deposited in a separate deposition chamber, such as a conventional parallel-plate RF enhanced chemical deposition system (PECVD) available from Applied Materials, Inc., Santa Clara Calif. The buffer layer can comprise an organic material, such as a polymerized organic layer, such as a hexamethyldisiloxane (HMDSO) layer, for example a fluorinated plasma-polymerized HMDSO (pp-HMDSO:F) and/or a polymer material composed of hydrocarbons where the polymer material has a formula $C_xH_yO_z$, wherein x, y and z are integers. In other embodiments, the buffer layer material is selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene, and combinations thereof.

At step 310, a glass substrate, disposed on a substrate support in a high density plasma CVD chamber and having an OLED device disposed thereon, is heated to a substrate temperature of below about 150° C., such as below about 100° C., for example between about 50° C. and about 100° C., such as about 90° C. In some embodiments, the substrate comprises a polymer such as polyethyleneterephthalate (PET) or polyethyleneterephthalate (PEN) and may be rigid or flexible. In other embodiments, the substrate is glass or metal or plastic with a flexible polymer disposed thereon. In some embodiments, a contact layer comprising a dielectric, such as SiN or SiO, is disposed between the substrate and the OLED device.

In some embodiments, the substrate temperature is controlled during deposition by heating and/or cooling the substrate support. Typically, a resistive heater embedded in the substrate support is used to heat the substrate. To cool the substrate, cooling fluids are flowed through cooling conduits disposed in the substrate support. In those embodiments, by actively controlling the cooling fluid flow rate, temperature, or both and the temperature of the resistive heater 298 using controller 280, the substrate temperature is maintained at a processing temperature of below about 150° C., such as between about 50° C. and 150° C., such as between about 100° C. and about 150° C., such as below about 100° C. The substrate 106 is firmly attached to the substrate support 210 by an electrostatic chuck in the substrate support 210.

At step 320, a bias is applied to the substrate support using an RF bias power source at a frequency at or below 13.56 MHz. To produce SiN layers having a compressive film stress, a lower RF bias power frequency such as below about 10 MHz, such as below about 1 MHz, or such as between about 200 kHz and 1 MHz, such as about 373 kHz or about 415 kHz is used. The RF bias power is dependent on the size of the substrate support and the substrate disposed thereon. For example, for a substrate support configured for a 500 mm by 730 mm substrate, the RF bias power is set at between about 500 W and about 8000 W, such as between about 500 W and about 5000 W. Appropriate scaling may be used for substrate supports for different sized substrates where the RF bias power per $cm^2$ of substrate 106 surface area is set at between about 130 millaWatts/$cm^2$ and about 2300 millaWatts/$cm^2$, such as between about 130 millaWatts/$cm^2$ and about 1400 millaWatts/$cm^2$.

At step 330, a silicon precursor gas and a nitrogen precursor gas are flowed into the processing volume 299 of the processing chamber 200 through the plurality of linear gas distribution conduits 221. The silicon precursor gas is any suitable silicon containing gas such as silane ($SiH_4$), disilane ($Si_2H_6$), trisilane ($Si_3H_3$), tetrasilane ($Si_4H_{10}$), silicon tetrafluoride (SiF$_4$), silicon tetrachloride (SiCl$_4$), dichlorosilane (SiH$_2$Cl$_2$), or mixtures thereof. The nitrogen precursor gas is any suitable nitrogen containing gas such as (N$_2$), ammonia (NH$_3$), diazene (N$_2$H2) hydrazine (N$_2$H$_4$), or mixtures thereof. In some embodiments, a carrier gas is also provided such as argon (Ar), hydrogen (H$_2$), helium (He), derivatives thereof, or mixtures thereof. In one embodiment, silane (SiH4), ammonia (NH4) and nitrogen (N2 (are coflowed through the plurality of linear gas distribution conduits 233 and into the processing volume 299. Herein, the silicon precursor gas and the nitrogen precursor gas are coflowed through the same linear gas distribution conduit. In other embodiments, the precursor gases are flowed through separate gas distribution conduits to prevent the precursor gases from prematurely reacting in the gas distribution conduits.

The flow rates of the precursor gases to the chamber are dependent on the size of the substrate and the chamber. For example, for a chamber sized to process a 500 mm by 730 mm substrate the total flow rate of a silicon precursor gas comprising SiH$_4$ is between about 150 sccm and about 3,000 sccm, such as between about 250 sccm and about 1,500 sccm, such as between about 300 sccm and about 900 sccm, such as about 480 sccm. The flow rate of nitrogen precursor gas comprising NH$_3$ to the chamber is between about 1,200 sccm and about 5,000 sccm, such as between about 2,000 sccm and about 4,000 sccm, such as about 3,000 sccm. When used, the flow rate of a carrier gas comprising Ar or comprising N$_2$ is between about 450 sccm and about 5,000 sccm, such as between about 500 sccm and about 3,500 sccm, for example about 2,500 sccm. Appropriate scaling may be used for chambers sized for other substrates where the gas flow ratio of SiH$_4$ to NH$_3$ (SiH$_4$:NH$_3$) is between about 1:2 and about 1:6, for example, about 1:3. The gas flow ratio of SiH$_4$ to Ar (SiH$_4$:Ar), when Ar is used, is between about 1:1 and about 1:20, for example, between about 1:5 and about 1:10. The gas flow ratio of NH$_3$ to Ar (NH$_3$:Ar), when Ar is used, is between about 1:1 and about 1:10, for example, between about 1:2 and about 1:5. The chamber pressure is maintained below 1 Torr, such as between about 50 mTorr and about 250 mTorr, such as below about 200 mTorr, such as below about 125 mTorr. The substrate is spaced apart from linear gas distribution conduits by a spacing distance of between about 3000 mil and about 10000 mil, such as about 7000 mil.

At step 340, a high density plasma, where the electron density is more than about $10^{11}$/cm$^3$, is formed using the argon gas, the silicon precursor gas, and the nitrogen precursor gas by the linear microwave plasma source (LPS) 233 such as that described in FIGS. 2A-2C hereof. The LPS power supplied at both ends of the conductive stub 235 has a frequency of between about 1 GHz and about 10 GHz, such as about 2.45 GHz or about 5.8 GHz. The power used is dependent on the size of the chamber, for example, for a chamber sized for a 500 mm by 730 mm substrate, the power is set at between about 500 W and about 8000 W, such as between about 500 W and about 5000 W, such as between about 1000 W and 4000 W. Appropriate scaling may be used for chambers sized for other substrates where the power is set at between about 130 millaWatts/cm$^2$ and about 2300 millaWatts/cm$^2$, such as between about 130 millaWatts/cm$^2$ and about 1400 millaWatts/cm$^2$, such as between about 270 millaWatts/cm$^2$ and about 1100 millaWatts/cm$^2$.

In some embodiments, the high density plasma is formed by inductively coupling a plasma source power (ICP) having a frequency of between about 1 MHz and about 20 MHz, such as about 13.56 MHz to the conductive stubs 235.

At step 350, a silicon nitride barrier layer is deposited over the exposed surface of the substrate 106. The silicon nitride barrier layer has a thickness of between about 500 Å and about 1 μm, such as between about 500 Å and about 0.5 μm, such as between about 500 Å and 3000 Å, such as between about 1000 Å and about 2000 Å. The silicon nitride barrier layer has a tensile or compressive stress of below about 150 MPa, such as below about 100 MPA. In some embodiments the silicon nitride barrier layer has a compressive stress of below about 150 MPa, such as a compressive stress of below about 100 MPa.

Figure 4A:
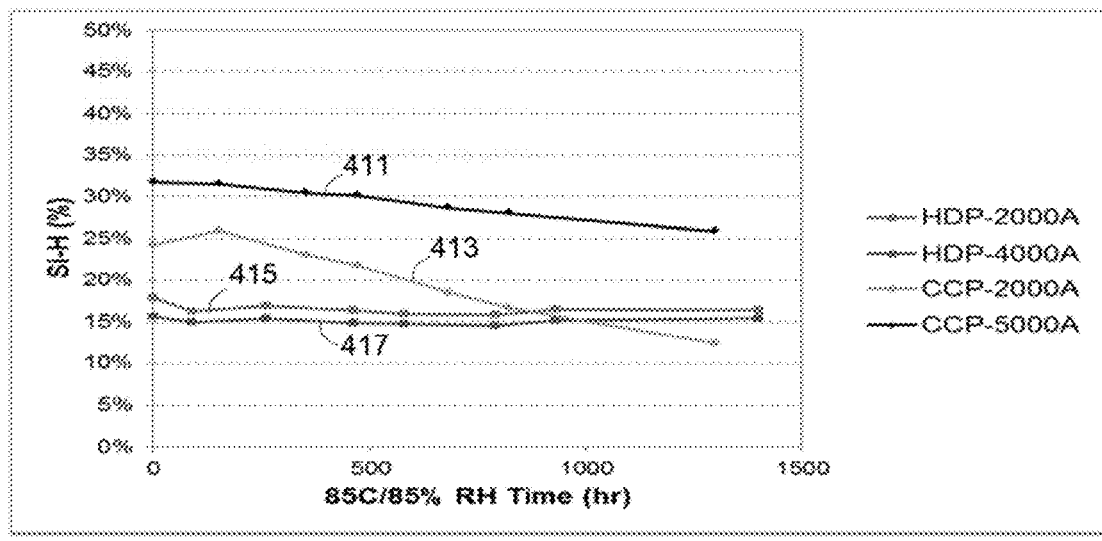
FIGS. 4A-4I show comparative measurements of barrier and other properties of silicon nitride layers deposited using high density plasma assisted chemical vapor deposition.
Figure 4B:
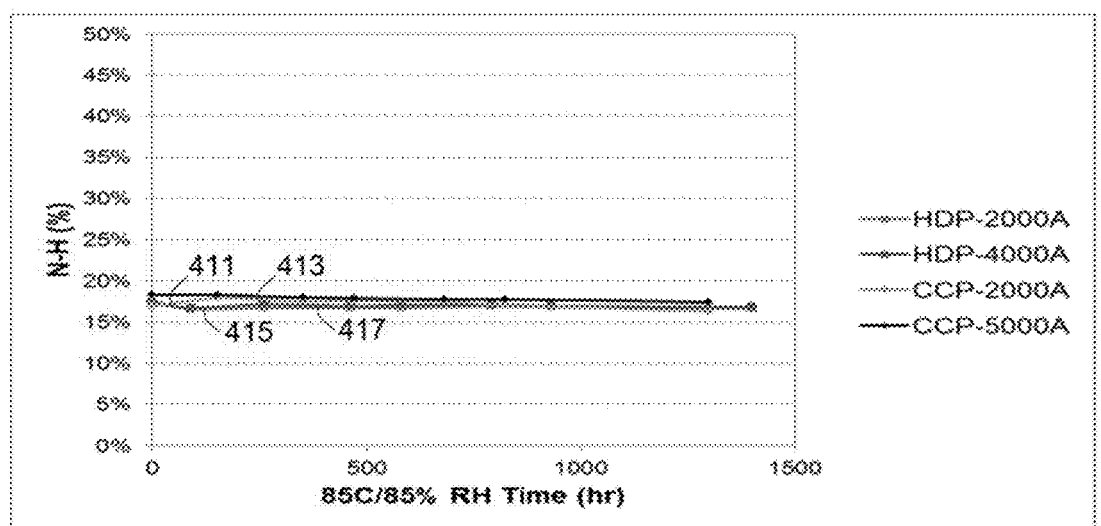

The method 300 provides for the deposition of a silicon nitride barrier layer resulting in a barrier stack with improved barrier properties against moisture and oxygen ingress therethrough to the underlying OLED device when compared to a barrier stack formed using a conventional capacitively coupled plasma (CCP) PECVD deposition process, as demonstrated in FIGS. 4A-4I. FIGS. 4A-4I show comparative measurements of barrier and other properties of silicon nitride layers deposited using HDP-CVD deposition, according to embodiments described herein, but without biasing the substrate during deposition, and of silicon nitride films deposited using conventional capacitive coupled plasma (CCP) PECVD deposition. FIGS. 4A-4B show the hydrogen concentration (% of Si—H terminated bonds in FIG. 4A and % of N—H terminated bonds in FIG. 4B) of silicon nitride layers held at 85° C. and 85% relative humidity from zero hours to less than about 1500 hours. As can be seen in FIG. 4A a 2000 Å HDP layer 415 and a 4000 Å HDP layer 415 of silicon nitride initially both showed fewer S—H terminated bonds than a 2000 Å CCP layer 413 and a 5000 Å CCP layer 411 at zero hours, but the hydrogen concentration of the CCP silicon nitride layers 411 and 413 declines over time. While Si—H bonds are not necessarily undesirable in a silicon nitride layer used as a barrier layer in a thin film encapsulation TFE structure, the decline of hydrogen concentration over time of the 2000 Å CCP layer 413 and a 5000 Å CCP layer 411 may indicate that the Si—H bonds are being replaced with undesirable Si—O bonds. This demonstrates the relative instability of conventionally deposited (CCP) silicon nitride layers 411 and 413 when compared to the HDP silicon nitride layers 415 and 417.

Figure 4C:
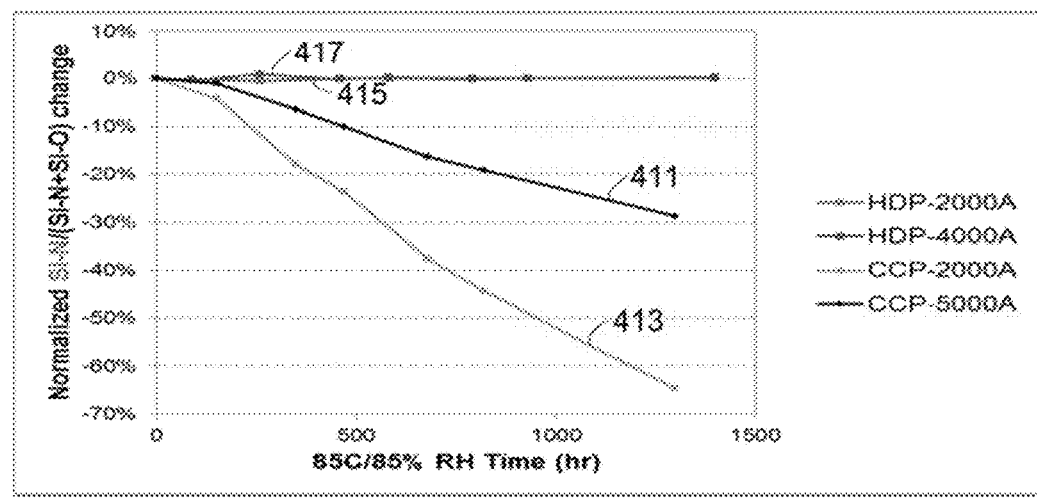
Figure 4D:
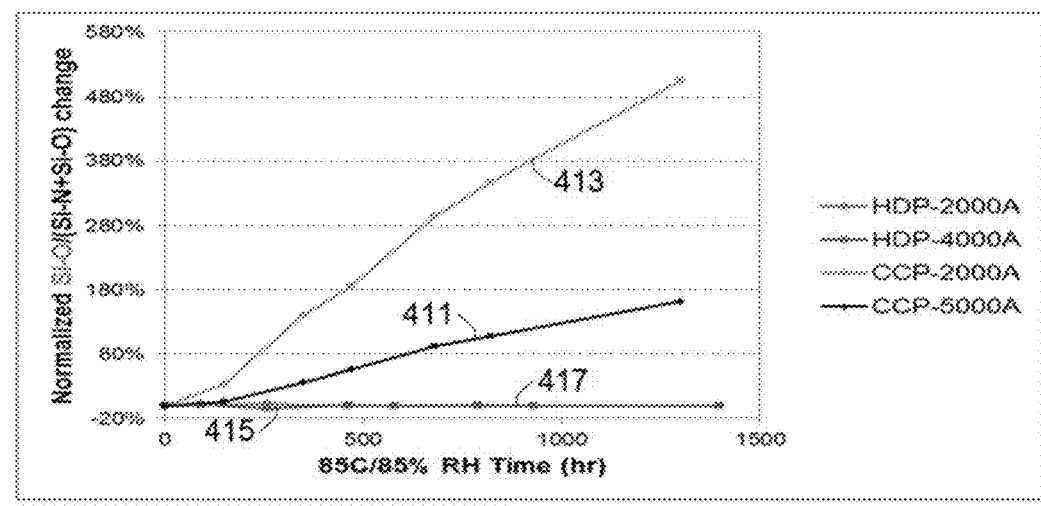

FIG. 4C shows the percentage change in the concentration of Si—N bonds in deposited silicon nitride layers from zero hours to less than 1500 hours when exposed to 85° C. and 85% relative humidity. FIG. 4D shows the percentage change in the concentration of Si—O bonds in the deposited silicon nitride layers of FIG. 4C over the same time period. The percentage change in concentration values in 4C and 4D have been normalized. As seen in FIGS. 4C and 4D the Si—O concentration of the CCP deposited layers 411 and 413 increases with time and predictably results in a decrease in Si—N in the deposited layers while the HDP silicon nitride layers remain stable with no to little perceptible shift in Si—O or Si—N over the same time period thereby indicating that the HDP silicon nitride layers have superior barrier properties to oxygen penetration when compared to CCP silicon nitride layers.

Figure 4E:
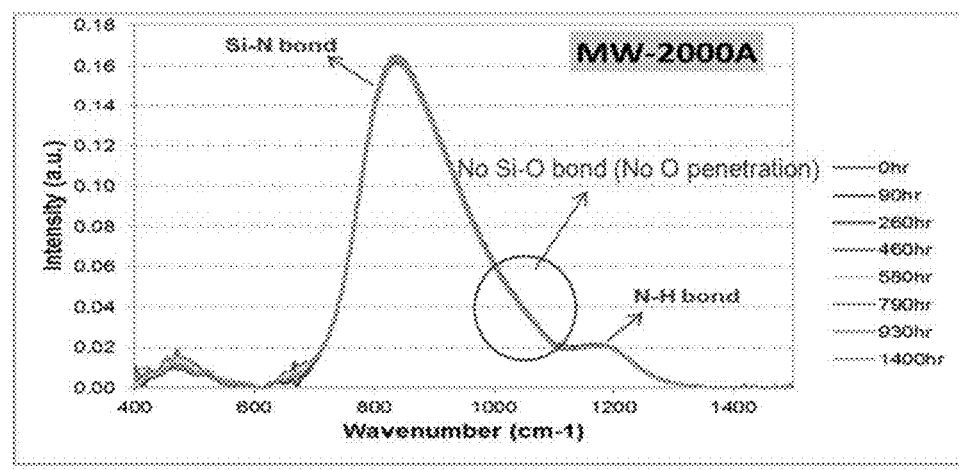
Figure 4F:
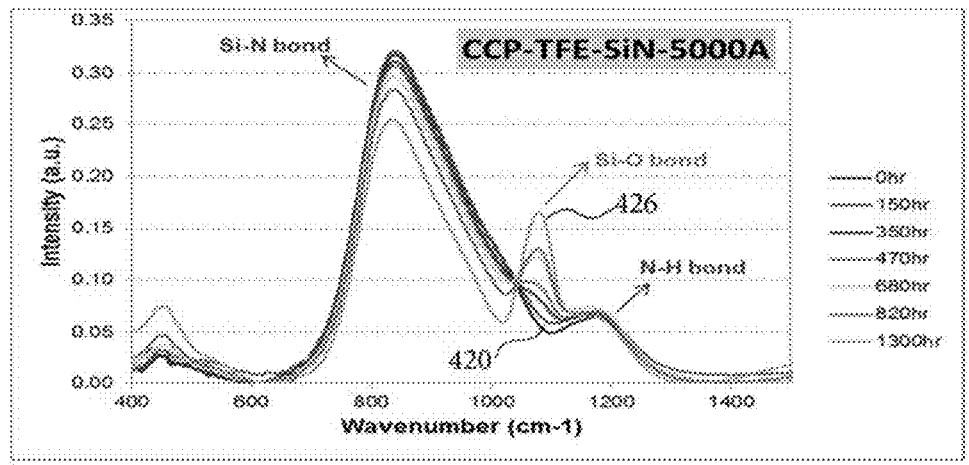
Figure 4G:
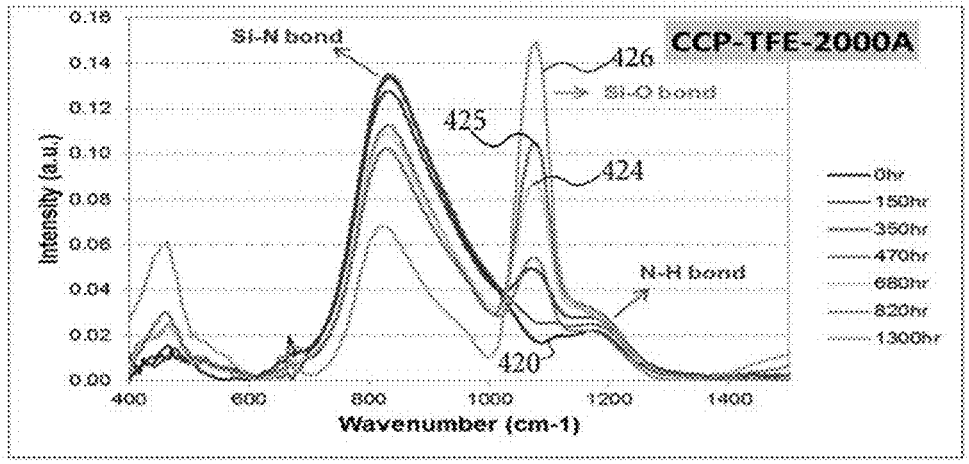

FIGS. 4E-4F show FTIR spectrums of HDP and CCP silicon nitride layers after exposure to 85° C. and 85% relative humidity at zero hours, 1400 hours, and increments in between. FIG. 4F shows that a 2000 Å HDD layer showed little to no change in the composition of the film from zero hours to 1400 hours of exposure, in particular, no to little change in the concentrations of Si—O bonds and Si—N bonds was observed up to 1400 hours indicating that there was no to little undesirable oxygen penetration of the 2000

Figure 4I:
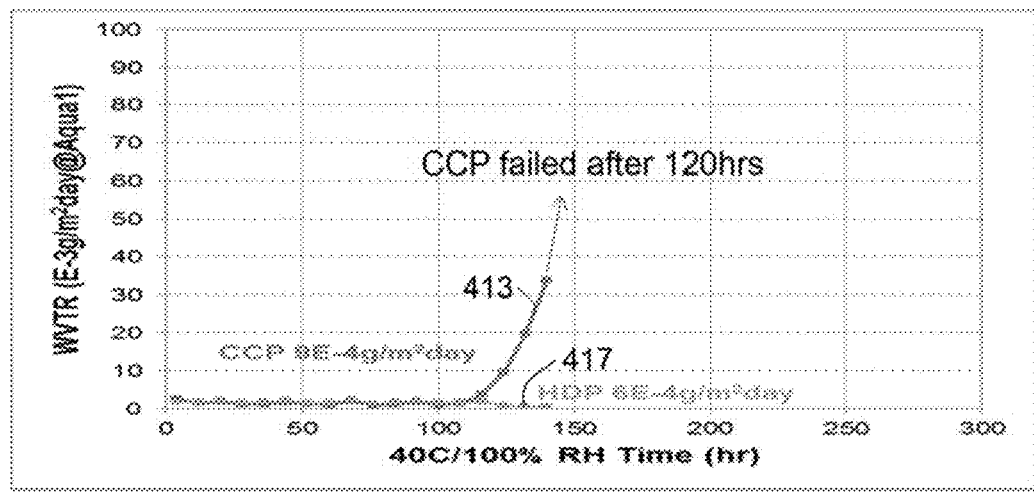
Figure 4H:
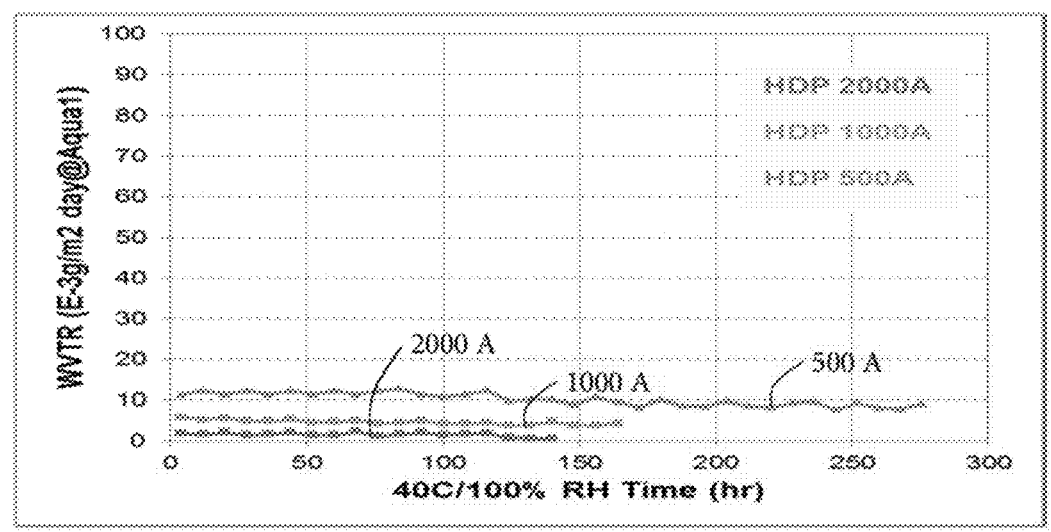
Figure 5A:
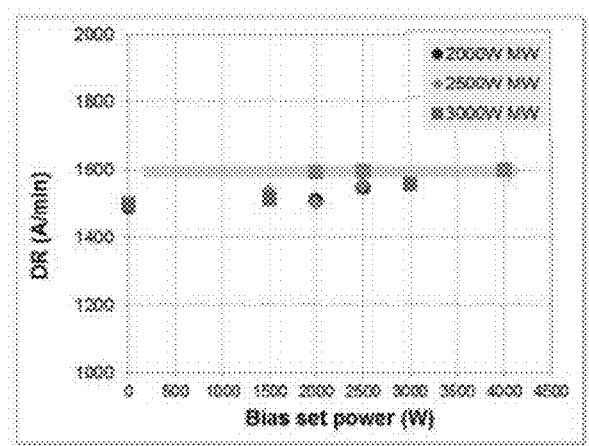
FIGS. 5A-5F show barrier and other properties of silicon nitride layers deposited using high density plasma assisted chemical vapor deposition, according to the embodiments described herein, including biasing the substrate support during the deposition of the silicon nitride layer.
Figure 5B:
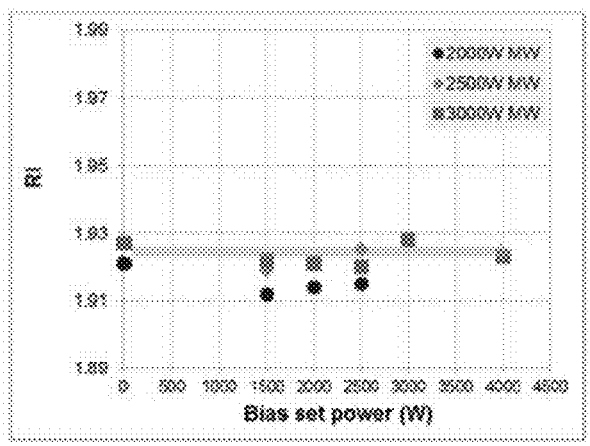
Figure 5C:
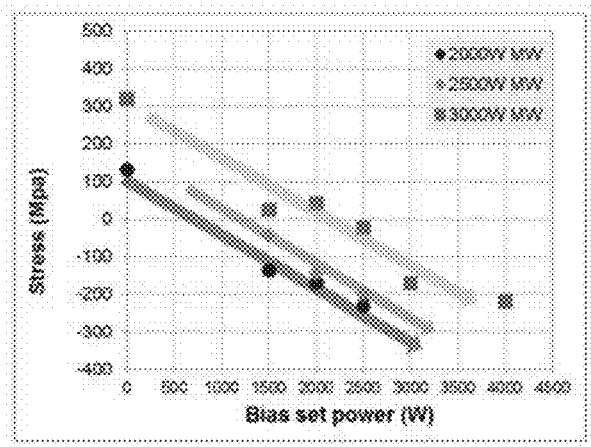
Figure 5D:
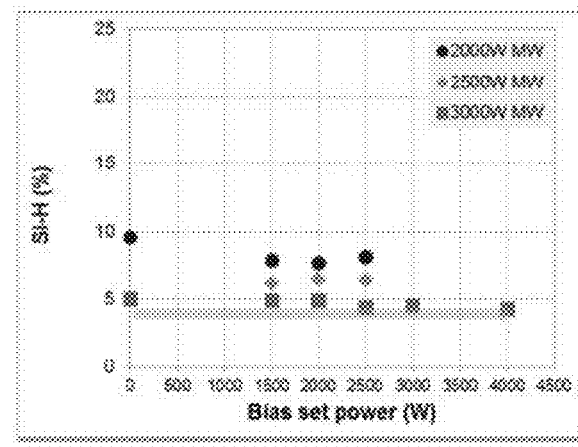
Figure 5E:
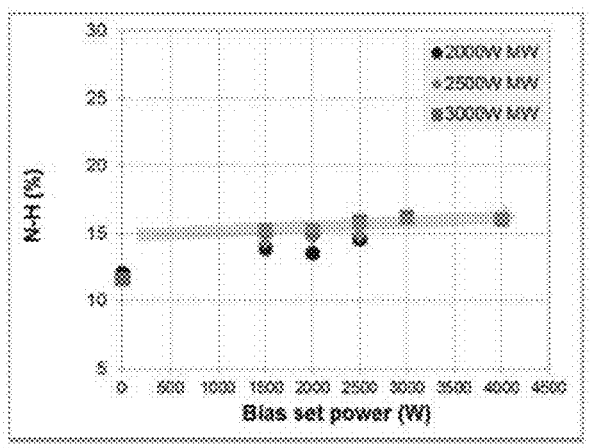
Figure 5F:
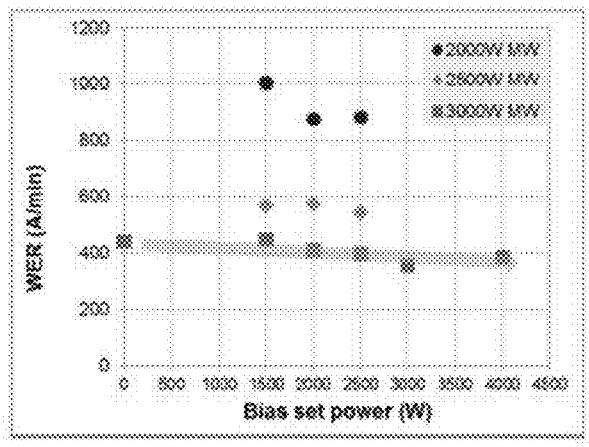

Å HDD layer. However, the conventional 5000 Å silicon nitride layer shows measurable increases in the concentrations of Si—O bonds from measurements taken from zero hours (420) to 1300 hours (426) and as seen in FIG. 4F. Probable oxygen penetration is more discernable in the 2000 Å CCP layer from 0 hours (420) to 680 hours (424), 820 hours of exposure (425), and 1300 hours of exposure (425) as the 2000 Å CCP layers shows higher concentration of Si—O bonds at increasing time intervals when compared to the 5000 Å CCP layers. FIGS. 4E-4F demonstrate that HDD silicon nitride layers, deposited according to embodiments disclosed herein, are a superior barrier to oxygen penetration than conventionally deposited CCP silicon nitride layers FIGS. 4H and 4I show the water vapor transmission rate (WVTR) of silicon nitride layers exposed to 40° C. and 100% relative humidity where lower WVTR indicate the silicon nitride layer's resistance to permeation of water therethrough. FIG. 4H shows the 2000 Å HDP layer 417 compared to the 2000 Å CCP layer 413, wherein the HDP layer has a relatively stable WVTR of about $6 \times 10^{-4}$ g/m$^2$ day with little to no change between zero hours and about 140 hours, however, the 3000 Å CCP layer 413 failed after about 120 hours when it no longer exhibited a measurable resistance to water permeation. FIG. 4I shows the WTVR of silicon nitride HDP layers over time and up to 275 hours, deposited according to embodiments disclosed herein, and having a thickness of 500 Å, 1000 Å, and 2000 Å.

In addition to the superior performance of HDP deposited silicon nitride when compared to conventionally CCP deposited silicon nitride, as shown in FIGS. 4H-4I deposited silicon nitride, HDP and CCP silicon nitride layers have substantially similar transmittance and step coverage properties. Both the HDP and CCP films had a greater than 90% transmittance at a 400 nm wavelength and a greater that 0.85 step coverage factor on a 2.5 µm step height pattern. HDP silicon nitride will also allow for desirably thinner barrier layers in a thin film encapsulation (TFE) structure, for example, conventional CCP silicon nitride layers in a TFE structure typically have a thickness of between 0.5 µm and 1 µm or more than 1 µm. As shown in FIGS. 4H-4I, the 2000 Å layer of HDP silicon nitride has significantly improved barrier properties when compared to the 5000 Å layer of CCP silicon nitride. This allows silicon nitride barrier layers in a thin film encapsulation structure to have a thickness of below about 5000 Å, such as between about 500 Å and about 5000 Å, such as between about 500 Å and about 3000 Å, such as between about 500 Å and 2000 Å or below about 2000 Å.

Table 1 and FIGS. 5A-5F show barrier and other properties of silicon nitride layers deposited using HDP-CVD deposition, according to the embodiments described herein, including biasing the substrate support during the deposition of the silicon nitride layer. As seen in Table 1, biasing the substrate support enables the deposition of low stress and/or compressive stress silicon nitride layers while maintaining the improved barrier properties of HDP-CVD silicon nitride layers compared to CCP silicon nitride layers as seen in FIGS. 4A-4I. The process properties and resulting silicon nitride film properties described in Table 1 are for a microwave linear plasma source (LPS) high density plasma assisted CVD deposited silicon nitride layer on a 500 mm by 730 mm substrate using SiH$_4$ and NH$_3$ precursors. The SiH$_4$ precursor flowrate was 480 sccm and the NH$_3$ precursor flowrate was 2700 sccm and the SiH$_4$ precursor, the NH$_3$, and the carrier gas, if used, were mixed prior to distribution into a chamber processing volume. No carrier gases were flowed for examples HD1 to HD14. HD15 had an Ar carrier gas flowrate of 1350 sccm and HD16 had an N$_2$ gas flowrate of 1350 sccm. The substrate was initially heated to a processing temperature of 90° C. The substrate temperature was monitored during deposition for examples HD3 to HD13 and it was observed that the substrate reached temperatures as high as 155° C., however, it is recognized that OLED devices will thermally degrade at process temperatures of more than about 100° C. and that the substrate temperature should be maintained at below about 100 100° C. during the manufacturing of thin film encapsulation (TFE) structures over a previously formed OLED device. The frequency of the LPS power was 2.45 GHz. Table 1 shows that the film stress of the HDP silicon nitride examples is responsive to changes in bias of the substrate support, where positive stress values indicate a tensile stress and negative stress values indicate a compressive stress.

TABLE 1

| Example Ref. Name | LPS Power W | Substrate Support Bias | | | | Deposition | Refractive | | | | Wet Etch | Substrate |
| | | Freq. KHz | set W | refl W | Load W | Thickness A/min | Rate A/min | Index metricon | Stress MPa | Si—H % | N—H % | Rate A/min | Temp. ° C. |
|---|---|---|---|---|---|---|---|---|---|---|---|---|---|
| HD1 | 2000 | | | | | 4467 | 1489 | 1.921 | 131 | 9.6 | 12.1 | 1249 | |
| HD2 | 3000 | | | | | 4501 | 1500 | 1.927 | 320 | 5.0 | 11.6 | 441 | |
| HD3 | 3000 | 373 | 4000 | 2500 | 1500 | 4795 | 1598 | 1.923 | −218 | 4.3 | 16.1 | 383 | 150 |
| HD4 | 3000 | 373 | 3000 | 1700 | 1300 | 4675 | 1558 | 1.928 | −170 | 4.5 | 16.2 | 358 | 144 |
| HD5 | 3000 | 373 | 2000 | 1300 | 700 | 4781 | 1594 | 1.921 | 43 | 4.9 | 15.3 | 408 | 150 |
| HD6 | 3000 | 373 | 2500 | 1500 | 1000 | 4785 | 1595 | 1.920 | −22 | 4.4 | 15.9 | 397 | 155 |
| HD7 | 2500 | 373 | 2500 | 1630 | 870 | 4659 | 1553 | 1.925 | −200 | 6.4 | 14.9 | 542 | 135 |
| HD8 | 2000 | 373 | 2500 | 1790 | 710 | 4643 | 1548 | 1.915 | −230 | 8.1 | 14.6 | 882 | 130 |
| HD9 | 3000 | 373 | 1500 | 985 | 515 | 4544 | 1515 | 1.922 | 25 | 4.9 | 15.3 | 449 | 135 |
| HD10 | 2500 | 373 | 2000 | 1454 | 546 | 4510 | 1503 | 1.921 | −145 | 6.5 | 14.8 | 572 | 133 |
| HD11 | 2500 | 373 | 1500 | 1060 | 440 | 4605 | 1535 | 1.919 | −44 | 6.2 | 14.3 | 567 | 137 |
| HD12 | 2000 | 373 | 2000 | 1420 | 580 | 4528 | 1509 | 1.914 | −170 | 7.7 | 13.6 | 876 | 130 |
| HD13 | 2000 | 373 | 1500 | 1140 | 360 | 4558 | 1519 | 1.912 | −137 | 7.9 | 13.9 | 1002 | 128 |
| HD14 | 2000 | 415 | 4000 | 2500 | 1500 | 4641 | 1547 | 1.915 | −343 | 7.4 | 14.8 | 865 | |
| HD15 | 2000 | 415 | 4000 | 2000 | 2000 | 4639 | 1546 | 1.920 | −297 | 6.3 | 13.7 | 574 | |
| HD16 | 2000 | 415 | 4000 | 1700 | 2300 | 4407 | 1469 | 1.920 | −490 | 7.4 | 14.5 | 1005 | |

FIGS. 5A-5F show the effect of substrate bias power (Bias set power (W)) on barrier and other properties of silicon nitride layers deposited using a microwave linear plasma source (LPS) high density plasma CVD deposition method according to the embodiments described herein. FIGS.

5A-5F show silicon nitride layers deposited using an LPS RF power of 2000 W (described as 2000 W MW in FIGS. 5A-5F), 2500 W (2500 W MW), and 3000 W (3000 W MW) where the RF power has a frequency of 2.45 GHz. Silicon nitride layers using the 2000 W, 3000 W, and 5000 W processes were deposited on a 500 mm by 730 mm substrate with the substrate support biased at powers between 0 W and 4000 W using a 373 KHz frequency RF power source. As can be seen in FIGS. 5A-5F, silicon nitride layer properties of deposition rates (DR), refractive indexes (RI), and Si—H concentrations (Si—H %) remained substantially unchanged as the substrate bias power was increased from 0 W to 4000 W while N—H concentrations ((Si—H %) saw small increases and the wet etch rates (WER) saw small decreases with increasing substrate bias power. Notably, the film stress (Stress) of the HDP deposited silicon nitride layers was tunable based on the substrate support bias power, by moving from highly tensile stresses in the range of 100 MPa (tensile) to 320 MPa (tensile) with no bias power to 150 MPa (compressive) to 250 MPa (compressive) when 2500 W to 4000 W were applied to the substrate support.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a film layer, comprising:
heating a substrate, disposed on a substrate support in a processing chamber, to a substrate temperature of below about 100° C.;
flowing a silicon precursor gas and a nitrogen precursor gas into the processing chamber;
forming a high density plasma of the nitrogen precursor gas and the silicon precursor gas;
depositing a silicon nitride layer on the substrate; and
controlling a film stress of the deposited silicon nitride layer by biasing the substrate while depositing the silicon nitride layer, wherein biasing the substrate comprises applying a biasing power to an electrode disposed in or on the substrate support, and wherein the applied biasing power is between about 130 millaWatts and about 2300 millaWatts per cm$^2$ of substrate surface area.

2. The method of claim 1, wherein the film stress of the silicon nitride layer is controlled by biasing the substrate to have a compressive or tensile stress of less than about 150 MPa.

3. The method of claim 2, wherein the film stress of the silicon nitride layer is controlled to have a compressive stress of less than about 150 MPa.

4. The method of claim 2, wherein the silicon nitride layer forms a barrier layer of a thin film encapsulation structure, wherein the thin film encapsulation structure comprises a first barrier layer deposited over an OLED device, an organic buffer layer deposited on the first barrier layer, and the silicon nitride layer deposited on the organic buffer layer, the silicon nitride layer forming a second barrier layer.

5. The method of claim 4, wherein a thickness of the second barrier layer is less than about 2000 Å.

6. The method of claim 1, wherein the silicon precursor gas comprises silane (SiH$_4$), disilane (Si$_2$H$_6$), trisilane (Si$_3$H$_3$), tetrasilane (Si$_4$H$_{10}$), silicon tetrafluoride (SiF$_4$), silicon tetrachloride (SiCl$_4$), dichlorosilane (SiH$_2$Cl$_2$), or mixtures thereof.

7. The method of claim 1, wherein the nitrogen precursor gas comprises nitrogen gas, ammonia, diazene, hydrazine (N$_2$H$_4$), or mixtures thereof.

8. The method of claim 1, wherein the high density plasma has an electron density of more than about 10$^{11}$/cm$^3$.

9. The method of claim 1, wherein the electrode is coupled to an RF power source having a frequency of between about 200 kHz and about 1 MHz.

10. The method of claim 9, wherein an RF power supplied by the RF power source is between about 130 millaWatts/cm$^2$ and about 1400 milliWatts/cm$^2$.

11. The method of claim 1, wherein the high density plasma is formed using an inductively coupled RF plasma source, a linear microwave plasma source, or an electron cyclotron resonance plasma source.

12. The method of claim 1, wherein a chamber pressure is maintained at below about 1 Torr.

13. A method of forming a film layer comprising:
flowing a silicon precursor gas and a nitrogen precursor gas into a processing chamber;
biasing an electrode coupled to a substrate support disposed in the processing chamber;
forming a plasma of the nitrogen precursor gas and the silicon precursor gas, wherein the plasma has an electron density of more than about 10$^{11}$/cm$^3$;
depositing a silicon nitride layer on a substrate disposed on the substrate support while maintaining a substrate temperature of between about 50° C. and about 150° C.; and
controlling a film stress of the deposited silicon nitride layer by biasing the substrate while depositing the silicon nitride layer, wherein biasing the substrate comprises applying a biasing power to an electrode disposed in or on the substrate support, and wherein the applied biasing power is between about 130 millaWatts and about 2300 millaWatts per cm$^2$ of substrate surface area.

14. The method of claim 13, wherein the electrode is coupled to an RF power source and wherein the RF power source has a frequency of between about 200 kHz and about 1 MHz.

15. The method of claim 13, wherein the substrate comprises glass, a flexible polymer, or a combination thereof.

16. The method of claim 13, wherein the electrode is coupled to an RF power source and wherein the RF power source has a frequency of less than about 10 MHz.

17. The method of claim 13, wherein the plasma is formed using a microwave plasma source, an inductively coupled plasma source, a linear microwave plasma source, or an electron cyclotron resonance plasma source.

18. The method of claim 13, wherein the silicon nitride layer forms a barrier layer of a thin film encapsulation structure, wherein
the thin film encapsulation structure comprises:
a first barrier layer deposited over an OLED device;
an organic buffer layer deposited on the first barrier layer; and
the silicon nitride layer is deposited on the organic buffer layer, wherein
the silicon nitride layer forms a second barrier layer, and
each of the first and second barrier layers have a thickness less than about 2000 Å.

19. A method of forming a thin film encapsulation structure, comprising:

heating a substrate, disposed on a substrate support in a processing chamber, to a temperature of below about 100° C.;

flowing a silicon precursor gas and a nitrogen precursor gas into the processing chamber;

forming a plasma of the nitrogen precursor gas and the silicon precursor gas, the plasma having an electron density of more than about $10^{11}/cm^3$;

depositing a silicon nitride layer onto the substrate; and controlling a film stress of the deposited silicon nitride layer by biasing the substrate while depositing the silicon nitride layer, wherein biasing the substrate comprises applying a biasing power to an electrode disposed in or on the substrate support, the applied biasing power is between about 130 millaWatts and about 2300 millaWatts per $cm^2$ of substrate surface area, the film stress of the deposited silicon nitride layer is controlled to less than about 150 MPa of compressive stress, and the silicon nitride layer forms a barrier layer of the thin film encapsulation structure, the thin film encapsulation structure comprising a first barrier layer deposited over an OLED device, an organic buffer layer deposited on the first barrier layer, and the silicon nitride layer deposited on the organic buffer layer, the silicon nitride layer forming a second barrier layer having a thickness less than about 2000 Å.

\* \* \* \* \*